United States Patent [19]

Lee

[11] Patent Number: 5,012,497
[45] Date of Patent: Apr. 30, 1991

[54] HIGH SPEED FREQUENCY DIVIDER CIRCUIT

[75] Inventor: Swye N. Lee, Lawrenceville, N.J.

[73] Assignee: David Sarnoff Research Center, Inc., Princeton, N.J.

[21] Appl. No.: 470,273

[22] Filed: Jan. 25, 1990

[51] Int. Cl.$^5$ .......................................... H03K 23/44
[52] U.S. Cl. ................................... 377/118; 377/105; 377/111
[58] Field of Search ................ 377/47, 105, 118, 121, 377/111

[56] References Cited

U.S. PATENT DOCUMENTS

| | | | |
|---|---|---|---|
| 3,707,071 | 12/1972 | Walton | 377/105 |
| 4,002,926 | 1/1977 | Moyer | 377/47 |
| 4,025,800 | 5/1977 | Wanlass | 377/121 |
| 4,369,379 | 1/1983 | Hull | 377/28 |
| 4,606,059 | 8/1986 | Oida | 377/47 |
| 4,715,052 | 12/1987 | Stambaugh | 377/108 |

FOREIGN PATENT DOCUMENTS 122128 7/1984 Japan .
122129 7/1984 Japan .
113527 6/1985 Japan .
113528 6/1985 Japan .

OTHER PUBLICATIONS

"CMOS Frequency Divider", IBM Technical Disclosure Bullentin, vol. 29, No. 6, Nov. 1986, pp. 2559–2560.

Primary Examiner—John S. Heyman
Attorney, Agent, or Firm—William J. Burke

[57] ABSTRACT

A frequency divider receives a first frequency signal and at least one clock signal of a sub-multiple of the first frequency. The first frequency signal charges a storage terminal once each first frequency cycle and the sub-multiple frequency signal discharges the storage terminal once each sub-multiple frequency cycle. The discharged storage terminal sets the frequency divider output which is reset by the first frequency signal when the storage terminal is discharged. The sub-multiple frequency clock signal is employed to control the storage terminal instead of a feedback path from the output to increase the operating frequency of the divider.

34 Claims, 4 Drawing Sheets

HIGH SPEED FREQUENCY DIVIDER CIRCUIT

This invention was made with Government support under Contract No. F33615-88-C-1825 awarded by the Department of the Air Force. The Government has certain rights in this invention

FIELD OF THE INVENTION

The invention relates to logic circuitry and more particularly to frequency divider and counter circuits having improved speed characteristics.

BACKGROUND OF THE INVENTION

Frequency divider circuits of various types are well known in the art. Such circuits generally include a signal processing path to perform the frequency division and a path from the output to the input to feedback the output state Japanese Patent No. 59-122128 (issued July 14, 1984) discloses a dynamic CMOS counter circuit that may be used as a frequency divider in which the state of the output of the circuit is fed back to control the state of an input storage terminal. The operating speed of a frequency divider is determined by the signal propagation delay through the circuit. The highest frequency at which the divider can operate is in large measure limited by the delay through the feedback path.

It is desirable to have an improved frequency divider which avoids feedback path delay and thereby provides faster operating speed and a higher operating frequency.

SUMMARY OF THE INVENTION

The invention is directed to a frequency divider operative in response to a signal of a predetermined frequency to form a signal at a sub-multiple thereof at its output. The frequency divider comprises a storing means put into a set condition by the predetermined frequency signal once during each cycle of the predetermined frequency and into a reset condition by a sub-multiple frequency clock signal once each cycle of the sub-multiple frequency. An output of the frequency divider is set to one logic state responsive to the storage terminal being in its reset condition and is set to a second logic state by the predetermined frequency signal when the storage terminal is in its reset condition.

In accordance with one aspect of the invention, the first frequency signal has first and second portions and the sub-multiple frequency clock has a first portion coincident with every other first portion of the first frequency signal. The storage terminal is charged to its set condition responsive to the second portion of the first frequency signal and is discharged to its reset condition responsive to the first portion of the sub-multiple frequency clock signal. The output is charged to one logic state when the storage terminal is in its discharged condition and is discharged by the first portion of the first frequency signal when the storage terminal is in its charged condition.

In accordance with one aspect of the invention, the sub-multiple clock signal comprises a plurality of different phase sub-multiple clock signals. One of the different phase sub-multiple clock signals is selected to control the phase of the frequency divider output signal.

In accordance with another aspect of the invention, the sub-multiple clock frequency is one half the predetermined frequency.

In accordance with yet another aspect of the invention, the frequency divider further comprises a circuit for forming a half frequency signal from the frequency divider output signal having first and second shift registers each with an input and an output. A first state signal is initially stored in the first shifter register and a second state signal is initially stored in the second shift register. The output of the first shift register is coupled to the input of the second shift register and the output of the second shift register is coupled to the input of the first shift register. The sub-multiple frequency output of the frequency divider controls the shift register coupling whereby the first and second state signals are coupled between the first and second shift registers at a frequency that is one half the sub-multiple frequency of the first stage output.

Viewed from another aspect, the present invention is directed to a frequency divider comprising storing means, means for receiving a first frequency signal and means for receiving at least one clock signal having a frequency that is a sub-multiple of the first frequency. An output of the frequency divider is adapted to be set to first and second logic states. The frequency divider further comprises means responsive to the first frequency signal and the at least one sub-multiple frequency clock signal for generating a sub-multiple frequency signal at the output comprising means responsive to the first frequency signal for placing the storing means in a set condition, means responsive to the at least one sub-multiple frequency signal for placing the storing means in a reset condition, means responsive to the storing means being in its reset condition for setting the output to the first logic state, and means jointly responsive to the storing means being in its set condition and the first frequency signal for resetting the output to the second logic state.

The invention will be better understood from the following more detailed description taken with the accompanying drawings and claims.

DETAILED DESCRIPTION

Figure 1:
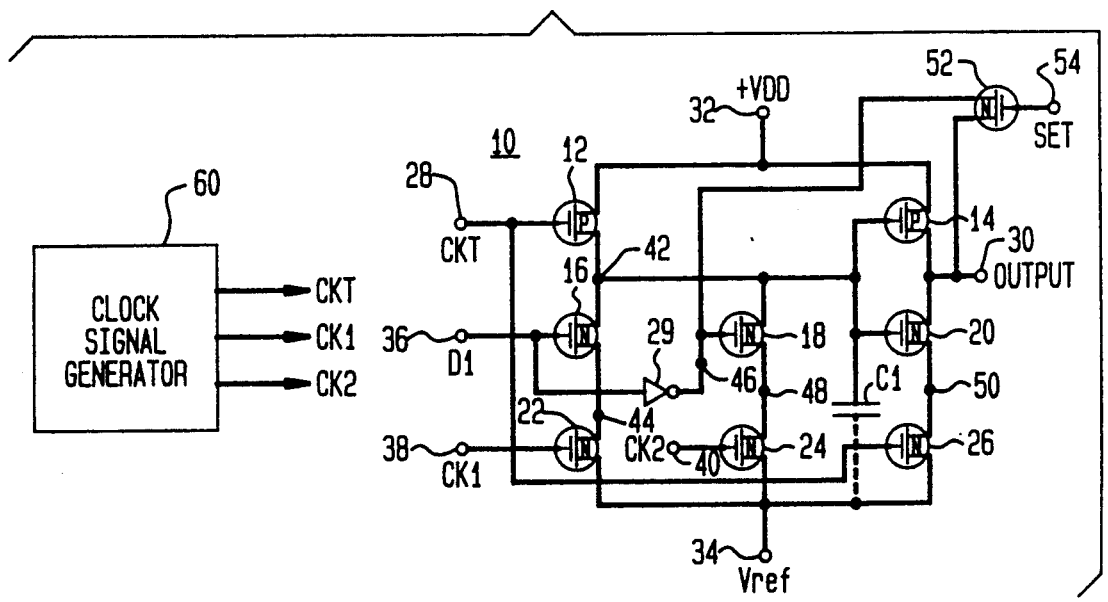
FIG. 1 shows in schematic and block diagram form a of a first stage of a frequency divider in accordance with the present invention.

Referring now to FIG. 1, there is shown in block and schematic form a frequency divider circuit 10 in accordance with the present invention. The circuit 10 comprises p-channel field effect transistors 12 and 14, n-channel field effect transistors 16, 18, 20, 22, 24, 26 and 52, an inverter 29, a capacitor C1 (shown in dashed lines) and a clock signal generator 60. Each of the transistors has a gate, a drain and a source and is typically a metal-oxide-semiconductor (MOS) field effect transistor (FET), a MOSFET. In a preferred embodiment each of the transistors is a thin film MOSFET which is formed on the glass of a liquid crystal display. Circuit 10 is capable of high speed operation and a signal with a given frequency applied to an input terminal 28 of circuit 10 results in an output signal being generated at an output terminal 30 which has one half of the frequency of the input signal.

The gates of transistors 12 and 26 are coupled to the input terminal 28 and to a first output terminal CKT of clock signal generator 60. The gate of transistor 16 and an input of inverter 29 are coupled to a control signal D1 and to a terminal 36. The gate of transistor 22 is coupled to a first clock terminal 38 which is coupled to an output CK1 of the clock signal generator 60. The gate of transistor 24 is coupled to a second clock terminal 40 which is coupled to an output CK2 of the clock signal generator 60. The gate of transistor 52 is coupled to a terminal 54 and to an initialization set signal SET. The sources of transistors 12 and 14 are coupled to a terminal 32 and to a power supply having an output voltage +VDD. The sources of transistors 22, 24 and 26 are coupled to a terminal 34 and to a reference power supply having a voltage of Vref (typically ground). The drains of transistors 12, 16 and 18 are coupled to the gates of transistors 14 and 20, to a first terminal of capacitor C1 and to a terminal 42. Capacitor C1, which may be denoted as a storage or storing means, is typically the parasitic capacitance associated with terminal 42 and the transistors coupled thereto. A second terminal of capacitor C1 is coupled to terminal 34. The source of transistor 16 is coupled to the drain of transistor 22 and to a terminal 44. An output of inverter 29 is coupled to the gate of transistor 18, to the drain of transistor 52 and to a terminal 46. The source of transistor 18 is coupled to the drain of transistor 24 and to a terminal 48. The drains of transistors 14 and 20 and the source of transistor 52 are coupled to the output terminal 30. The source of transistor 20 is coupled to the drain of transistor 26 and to a terminal 50.

Figure 4:
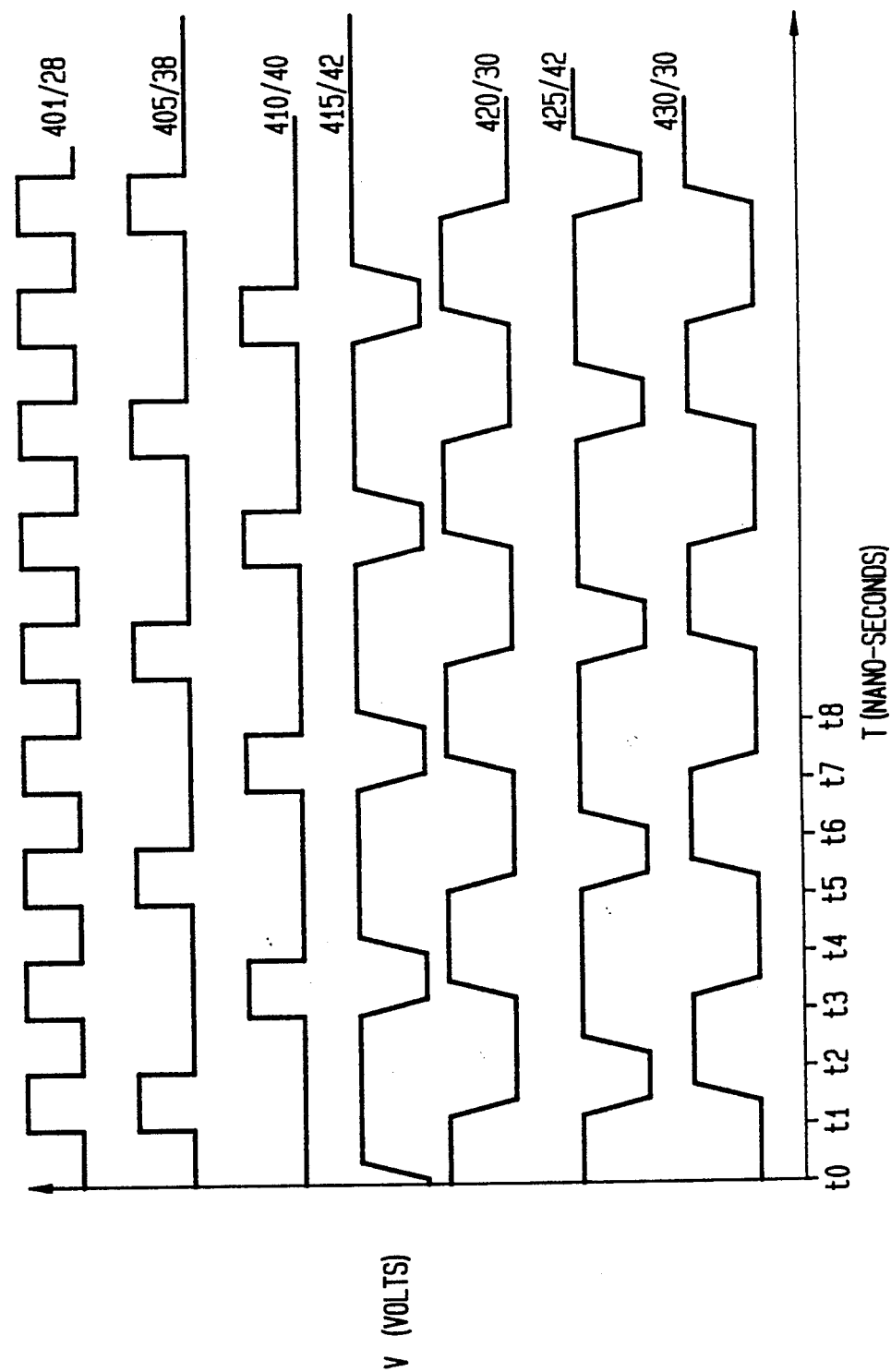
FIG. 4 is a timing diagram that illustrates the operation of the embodiment shown in FIG. 1.

Referring now to FIG. 4, there are shown waveforms of voltage V(VOLTS) versus time T (nanoseconds) of various terminals of circuit 10 of FIG. 1. The waveforms shown all have essentially the same amplitude, although that is not essential to the operation, and each has essentially the same high and low logic levels. Initially the initialization set signal SET (not shown in FIG. 4) is pulsed from a normal "0" to a "1" and then is pulsed back to a "0". CKT, CK1 and CK2 are all "0's" at this time. Control signal D1 can be a "1" or a "0". If D1="1", then output terminal 30 is initially set to a "0". Conversely, if D1="0", then output terminal 30 is initially set to a "1". Waveform 401 illustrates the input clock signal CKT generated in clock signal generator 60 and applied to input terminal 28. Waveforms 405 and 410 show the clock signals CK1 and CK2 applied to terminals 38 and 40, respectively. Waveforms 415 and 420 show the signals at terminal 42 and output terminal 30, respectively, when the control signal D1 applied to terminal 36 is at a zero (a "0") voltage level. Waveforms 425 and 430 show the signals at terminal 42 and output terminal 30, respectively, when the signal applied to the terminal 36 is at a one (a "1", high) voltage level.

The frequency divider circuit 10 of FIG. 1 is adapted to produce the signal shown in waveform 420 or waveform 430 at output terminal 30 in response to a clock signal on terminal CKT which is applied to input terminal 28. The signal on terminal CKT is a signal (e.g. a square wave) having a predetermined frequency. Where CKT is a square wave, circuit 10 operates as a divide by two type counter. Waveforms 420 and 430 are different phase square waves which have one half the frequency of the input signal applied at terminal CKT. Clock signals on terminals CK1 and CK2 are voltage pulses shown in waveforms 405 and 410 which occur at a sub-multiple (e.g. one-half the frequency) of the signal on terminal CKT. A variety of well known pulse generating circuits may be used as clock signal generator 60.

Assume for purposes of illustration that output terminal 30 is a "1" and that terminal 42 is a "0", as shown at time T=t0 in waveforms 415 and 420 and further that terminal 36 is fixed at a "0". N-channel transistor 16 is disabled by the "0" applied to its gate from terminal 36. N-channel transistor 18 is enabled responsive to the "1" at its gate from the output of inverter 29. Input clock CKT (waveform 401) is a "0" between T=t0 and t1.

In the time interval between times T=t0 and t1, p-channel transistor 12 is enabled in response to the "0" at its gate from input terminal 28. Transistors 22 and 24 are disabled since clock signals CK1 and CK2 (waveforms 405 and 410) are "0's" between T=t0 and t1. Enabled transistor 12 conducts and charges (pulls up) the terminal 42 to a "1" (i.e., +VDD) as is shown in waveform 415. Transistor 26 is disabled by the "0" at its gate from input terminal 28 so that output terminal 30 remains at a "1". The parasitic capacitance C1 (shown as a dashed line capacitor) associated with terminal 42 stores charge and serves as a logical condition store which may be denoted as a storing means.

Between times T=t1 and t2, the "1" of the signal on terminal CKT (waveform 401) enables n-channel transistor 26 and output terminal 30 (waveform 420) discharges to a "0". Transistor 16 is disabled by the "0" at its gate. Clock signal CK2 (waveform 410) applied to the gate of transistor 24 is a "0" between times T=t1 and t2 and therefore transistor 24 is disabled. Terminal 42 (waveform 415) remains at a "1" between times T=t1 and t2 and until time T=t3 when transistor 24 is enabled by the "1" signal CK2. Between times T=t3 and t4, the gate of n-channel transistor 18 is at the "1" of the output of inverter 29 and the gate of n-channel transistor 24 is at the "1" of the clock signal on terminal CK2. Transistors 18 and 24 are thereby both enabled and the terminal 42 discharges through these transistors to a "0". P-channel transistor 14 is enabled by the "0" applied to its gate (terminal 42). Output terminal 30 (waveform 420) is charged through transistor 14 to the "1" level of +VDD shortly after time T=t3.

During the interval between T=t4 and t5, input signal CLK is "0". Transistor 12 is enabled and transistor 24 is disabled by the "0" on the terminal CLK 2. Current flows through transistor 12 charges terminal 42 to a "1" after T=t4 (waveform 415). Output terminal 30 remains at a "1" until transistor 26 is enabled by the "1" at its gate from input terminal 28 (waveform 401) and transistor 20 is enabled by the "1" at terminal 42. Between T=t5 and t6, output terminal 30 is discharged through transistors 20 and 26. The operations described between T =t0 and t6 are repeated in subsequent time intervals. As a result, the signal at output terminal 30 occurs at a sub-multiple, e.g. one half, of the predetermined frequency of signal CLK.

If control terminal 36 is set at a "1", transistor 16 is enabled but transistor 18 is disabled by the "0" at its gate from the output of inverter 29. Clock signal CK1 (waveform 405) at terminal 36 then controls the discharge of terminal 42. The operation of circuit 10 with control terminal 36 at a "1" is shown in waveforms 425 and 430. Assume for purposes of illustration that terminal 42 is at a "1" at T=t0 as is shown in waveform 425 and that output terminal 30 is at a "0" at T=t0 as is shown in waveform 430. Terminal 42 is discharged through transistors 16 and 22 by the "1" of clock signal applied to terminal CK1 (waveform 405) at the gate of transistor 22 between T=t1 and t2 and the "1" control signal at the gate of transistor 16.

Between T=t1 and t2, the "0" on terminal 42 enables transistor 14 and disables transistor 20. Current flow through transistor 14 charges output terminal 30 (waveform 430) to a "1". Terminal 42 is charged to a "1" by current flow through transistor 12 in response to the "0" of signal CKT at input terminal 28 between T=t2 and t3. In the interval between T=t3 and t4, transistor 20 is enabled by the "1" at its gate from terminal 42 (waveform 425) and transistor 26 is enabled (turned on or biased on) by the "1" of the input signal CKT at terminal 28 (waveform 401). Output terminal 30 (waveform 430) discharges through serially connected transistors 20 and 26 to a "0" shortly after T=t3.

When clock signal applied to terminal CK1 is again at a "1" between T=t5 and t6 (waveform 405), transistor 22 is on such that terminal 42 discharges through transistors 16 and 22 to a "0". The "0" at terminal 42 enables transistor 14 and disables transistor 20 between T=t5 and t6. Output terminal 30 is charged by the source current of transistor 14 to a "1". As readily seen in FIG. 4, the signal at output terminal 30 is one-half the predetermined frequency of the signal applied to input terminal 28. Where CKT is a square wave, circuit 10 operates as a divide by two type counter. The control signal D determines the phase of the signal at output terminal 30. Waveform 420 obtained when control signal D is a "0" and waveform 430 obtained when control signal D is a "1" are opposite in phase.

In contrast to prior art frequency dividers such as described in aforementioned Japanese Patent No. 59-122128, the frequency divider circuit 10 of the present invention does not employ a feedback path to discharge storage terminal 42. Rather, clock signals CK1 and CK2 provide the necessary information about the state of the output terminal 30 without a feedback path. To switch output terminal 30 from a "1" to a "0" within one clock cycle, it is only necessary to charge terminal 42 through transistor 12 when the signal at input terminal 28 is a "0" and then discharge output terminal 30 through transistors 20 and 26 after the signal at input terminal 28 becomes a "1". To switch output terminal 30 from a "0" to a "1", it is only necessary that terminal 42 be discharged through transistors 16 and 22 or 18 and 24 when clock CK1 or CK2 and the signal at the input terminal 28 are "1's". Advantageously, feedback path delay, such as from output terminal 30 to the gate of transistor 22 or transistor 24, as in known frequency dividers, is avoided. Consequently, the operating frequency can be much higher.

Figure 2:
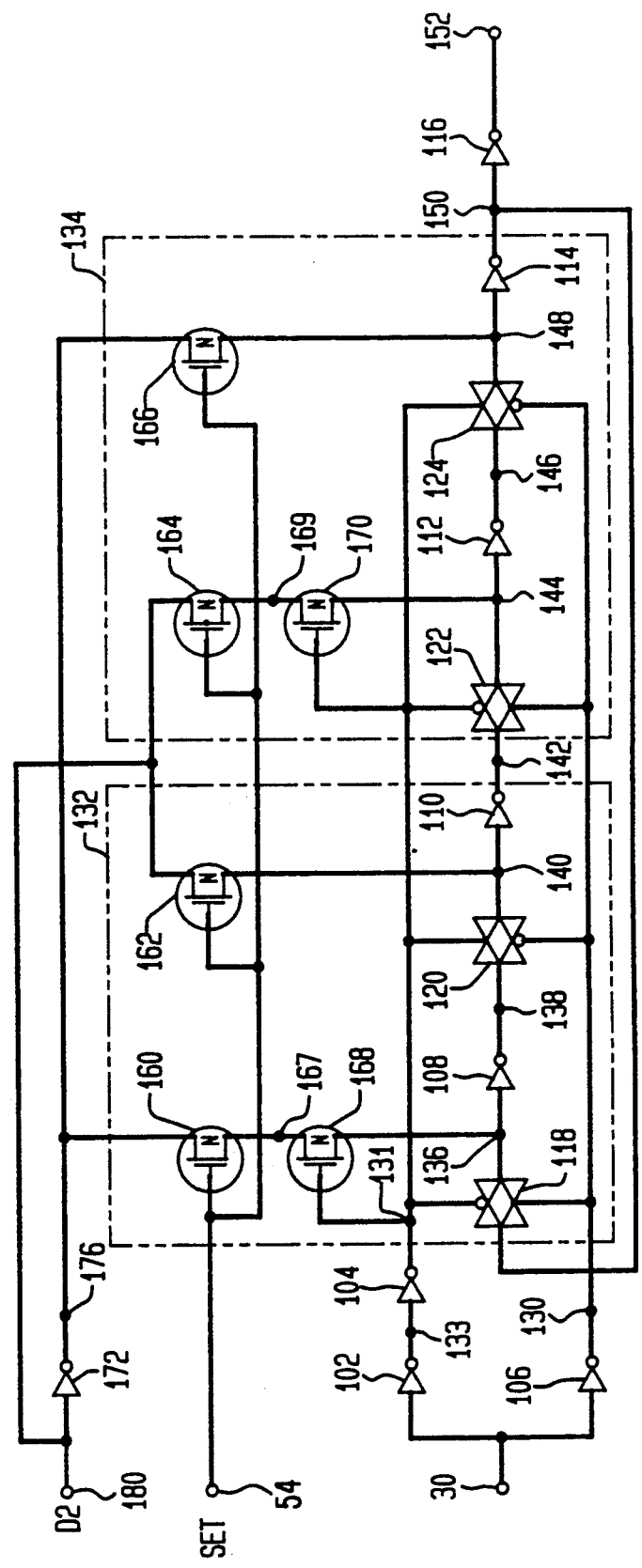
FIG. 2 shows in schematic and block diagram form another embodiment in accordance with the present invention.

Referring now to FIG. 2, there is another frequency divider circuit 100 in accordance with the present invention. In a preferred embodiment circuit 100 serves as a second stage of a two stage frequency divider circuit with circuit 10 of FIG. 1 serving as the first stage. As such the output terminal 30 of circuit 10 is coupled to an input terminal of circuit 100. The circuit 100 comprises shift registers 132 and 134 (both shown with in separate dashed line rectangles) and inverters 102, 104, 106, 116 and 172. The shift register 132 comprises transmission gates 118 and 120 (also denoted as TG 118 and 120), inverters 108 and 110 and n-channel field effect transistors (FETs) 160, 162 and 168. The shift register 134 comprises transmission gates 122 and 124 (also denoted as TG 122 and 124), inverters 112 and 114 and n-channel FETs 164, 166 and 170. Each of the inverters has an input and an output; each of the transistors has a gate, a drain and a source; and each of the transmission gates has first and second input/outputs, a clock input and an inverted clock input. Each of the transistors has a gate, a drain and a source and is typically a metal-oxide-semiconductor (MOS) field effect transistor (FET), a MOSFET. In a preferred embodiment each of the transistors is a thin film MOSFET which is formed on the glass of a liquid crystal display. A typical embodiment of a transmission gate (TG) is show in FIG. 3 and is described hereinbelow.

Output terminal 30 of circuit 10 of FIG. 1 is coupled to the inputs of inverters 102 and 106 of circuit 100 of FIG. 2. The output of inverter 102 is coupled to the input of inverter 104 and a terminal 133. The output of inverter 104 is coupled to the clock inputs of transmission gates 120 and 124, to the inverted clock inputs of transmission gates 118 and 122, to the gates of transistors 168 and 170, and to a terminal 131. The output of inverter 106 is coupled to a terminal 130, to the clock inputs of transmission gates 118 and 122, and to the inverted clock inputs of transmission gates 120 and 124.

In shift register 132, the output of transmission gate 118 is coupled to the input of inverter 108, to the source of transistor 168 and to a terminal 136. The output of inverter 108 is coupled to the input of transmission gate 120 and to a terminal 138. The output of transmission gate 120 is coupled to the input of inverter 110, to the source of transistor 162, and to a terminal 140. The output of inverter 110 is coupled to the input of transmission gate 122 of shift register 134 and to a terminal 142 which serves as an output of shift register 132 and as an input of shift register 134. The output of transmission gate 122 is coupled to the input of inverter 112, to the source of transistor 170, and to a terminal 144. The output of inverter 112 is coupled to the input of transmission gate 124 and to a terminal 146. The output of transmission gate 124 is coupled to the input of inverter 114, to the source of transistor 166, and to a terminal 148. The output of inverter 114 is coupled to an output of shift register 134, to an input of transmission gate 118 of shift register 132 and to a terminal 150. An output of inverter 116 is coupled to an output terminal of circuit 100 and to a terminal 152.

The drains of transistors 162 and 164 are coupled to a control signal D2, to the input of inverter 172 and to a terminal 180. The drains of transistors 160 and 166 are coupled to the output of inverter 172 and to a terminal 176. The gates of transistors 160, 162, 164 and 166 are coupled to the set terminal 54 and to a initialization set signal SET. The source of transistor 160 is coupled to the drain of transistor 168 and to a terminal 167. The source of transistor 168 is coupled to the terminal 136. The source of transistor 162 is coupled to the terminal 140. The source of transistor 164 is coupled to the drain of transistor 170 and to a terminal 169. The source of transistor 170 is coupled to the terminal 144. The source of transistor 166 is coupled to the terminal 148.

Figure 5:
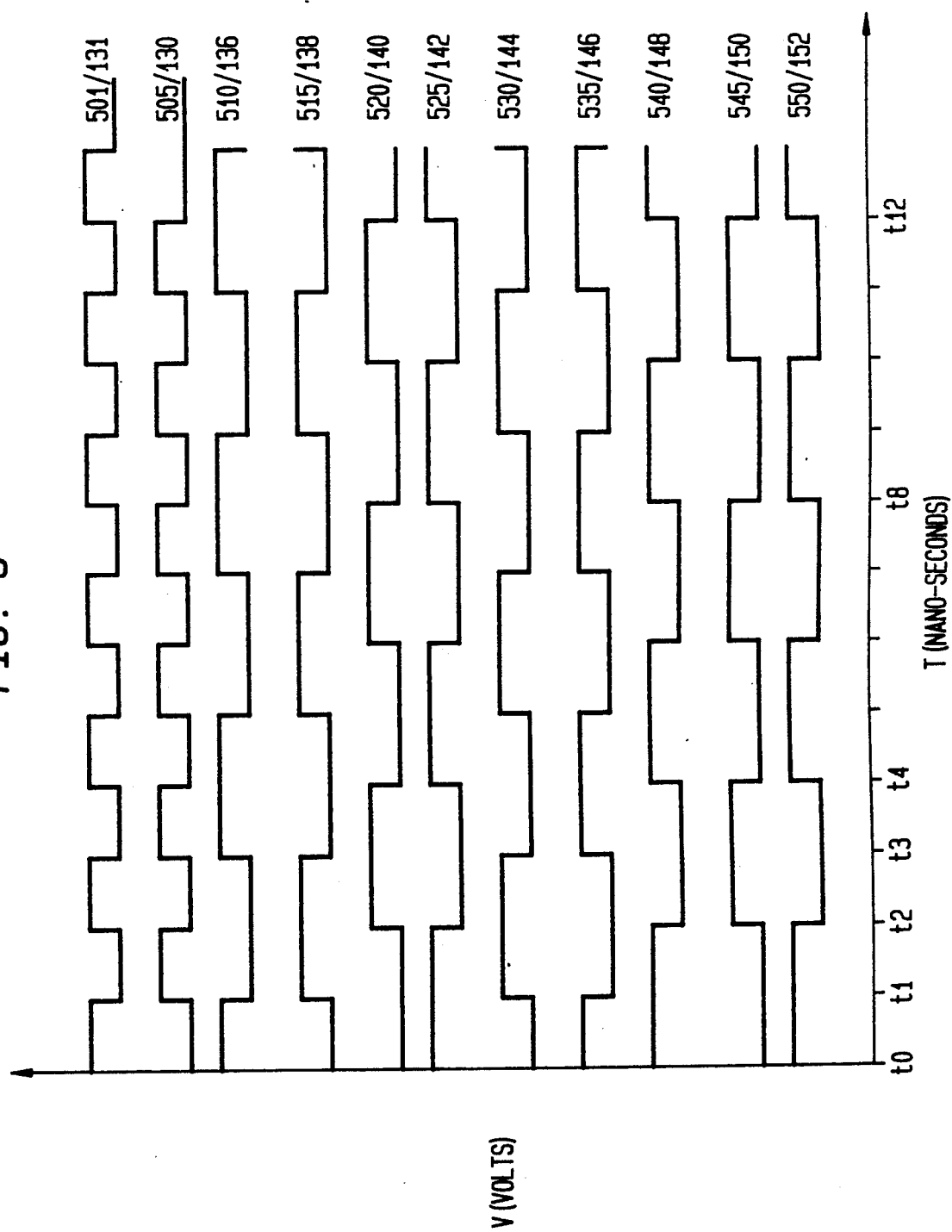
FIG. 5 is a timing diagram that illustrates the operation of the embodiment shown in FIG. 2.

Referring now to FIG. 5, there are shown voltage waveforms versus time of various terminals of circuit 100 of FIG. 2. The waveforms shown all have essentially the same amplitude, although that is no essential to the operation, and each has essentially the same "1" and "0" logic levels. Waveform 501 shows the voltage V(VOLTS) of terminal 131 (the output of inverter 104 versus time T(nanoseconds). Waveform 505 shows the voltage V(VOLTS) of terminal 130 (the output of inverter 106 versus time T(microseconds). Waveforms 510, 515, 520, 525, 530, 535, 540, 545 and 550 of circuit 100 at terminals 136, 138, 140, 142, 144, 146, 148, 150 and 152, respectively, show voltage V(VOLTS) versus time T(nanoseconds) for each of the waveforms.

A clock signal from the output (terminal 131) of inverter 104 is applied to the gates of the p-channel transistors (shown only in FIG. 3) in transmission gates 118 and 122 and to the gates of the n-channel transistors (shown only in FIG. 3) in transmission gates 120 and 124. The inverse clock signal from output terminal 130 of inverter 106 (i.e., the clock signal on terminal 131)is applied to the gates of the n-channel transistors (shown only in FIG. 3) in transmission gates 118 and 122 and to the gates of the p-channel transistors (shown only in FIG. 3) in transmission gates 120 and 124. Consequently, in intervals when the clock signal at the output of from inverter 104 (terminal 131) is a "1" and the inverse clock signal from the output of inverter 106 (terminal 130) is a "0", e.g. between T = t0 and t1, transmission gates 118 and 122 are open (essentially an open circuit or a high impedance) and transmission gates 120 and 124 are closed (essentially a short circuit or a low impedance). Transmission gates 118 and 122 are closed and transmission gates 120 and 124 are open when the clock signal from inverter 104 is a "0" and the inverse clock signal from inverter 106 is a "1", e.g. between T = t1 and t2.

The initial states of shift registers 132 and 134 are determined by the control signal D2 applied to terminal 180. As aforementioned with respect to the circuit 10 of FIG. 1, control signal D1 establishes the phase of the circuit 10 output signal at terminal 30. When signal D2 is a "1", the initial states, i.e, the voltages of terminals 142 and 150, of shift register 132 and 134, respectively, are set to a "0" and a "1", respectively. If control signal D2 is a "0", the initial states of shift register 132 and 134 are set to a "1" and a "0", respectively.

Assume control signal D2 is a "1" and initialization set signal SET applied to the terminal 54 is a "1". The drains of transistors 162 and 164 are at "1's" and the drains of transistors 160 and 166 receive a "0" from the output (terminal 176) of inverter 172. Transistors 160, 162, 164 and 166 are enabled by the "1" from signal SET at their gates. The initialization set signal SET (not shown in FIG. 5) is typically a relatively short duration pulse which is used to selectively enable transistors 160, 162, 164 and 166 and to then disable same. The sources (terminals 167 and 148, respectively) of transistors 60 and 166 are at "0's" while the sources (terminals 140 and 169, respectively) of transistors 162 and 164 are at "1's". Transistors 168 and 170 are enabled when the output (terminal 131) of inverter 104 is a "1".

With control signal D2 = "1", during each interval when the clock signal at the output of inverter 104 is a "0" and the clock signal at the output of inverter 106 is a "1", TG's 118 and 122 are closed, TG's 120 and 124 are open and transistors 168 and 170 are disabled. Terminal 140 is thus a "1". The "0" on the gates of transistors 168 and 170 disable both transistors. Accordingly, terminal 142 becomes a "0" which is transmitted by closed TG 122 to terminal 144. Inverter 112 inverts the "0" at terminal 144 and generates a "1" at terminal 146. Enabled transistor 166 generates a "0" at terminal 148 since TG 124 is open at this time. Inverter 114 inverts the "0" at its input and generates a "1" at terminal 150. Inverter 116 inverts the "1" at its input and generates a "0" at terminal 152. The "1" at terminal 150 passes through TG 118 and causes terminal 136 to be a "1". Inverter 108 inverts the "1" at its input and generates a "0" at terminal 138.

With the control signal D2 = "1" during each interval when the clock signal at the output of inverter 104 is a "1" and the clock signal at the output of inverter 106 is a "0", TGs 118 and 122 are open and TGs 120 and 124 are closed. Transistors 168 and 170 are enabled. Thus terminal 136 is set to a "0" and terminal 144 is set to a "1". The "0" on terminal 136 is inverted by inverter 120 and becomes a "1" on terminal 138. The "1" on terminal 138 is transmitted through TG 120 and thus terminal 140 is set to a "1". Inverter 110 inverts the "1" at its input and generates a "0" at terminal 142. The "1" on terminal 144 is inverted by inverter 112 and becomes a "0" on terminal 146 which is transmitted through closed TG 124 and causes terminal 148 to be set to a "0". Transistor 166 had set terminal 148 to a "0" so it stays at a "0" level. Inverter 114 inverts the "0" at its input and generates a "1" on terminal 150. Inverter 116 inverts the "1" at its input and generates a "0" at terminal 152.

Now assume that control signal D2 (at terminal 180) is a "0" and initialization set signal SET applied to the terminal 54 is a "1". The drains of transistors 160 and 166 are at a "1" since the output (terminal 176) of inverter 172 is a "1". The drains of transistors 162 and 164 are at a "0". Transistors 160, 62, 164 and 166 are enabled by the "1" signal SET. The sources of transistors 162 and 164 are at a "0" while the sources of transistors 160 and 166 are at a "1". Transistors 168 and 170 are enabled when the clock signal from inverter 104 applied to their gate is a "1". Accordingly, with terminal 131 set to a "1", terminals 136 and 148 are set to a "1" and terminals 140 and 144 are set to a "0"."

With D2 = "0", during each interval when the clock signal at the output of inverter 104 is a "0" and the clock signal at the output of inverter 106 is a "1", TGs 118 and 122 are closed and TGs 120 and 124 are open. Transistors 168 and 170 are disabled so that terminals 136 and 144 are effectively isolated from terminals 167 and 169, respectively. Terminal 140 is set to a "0" and terminal 148 is set to a "1". The "1" on terminal 148 is inverted by inverter 114 and becomes a "0" at terminal 150. The "0" at terminal 150 is inverted by inverter 116 and becomes a "1" at terminal 152. It is also transmitted through TG 118 and causes terminal 136 to be set to a "0". The "0" on terminal 136 is inverted by inverter 108 and becomes a "1" on terminal 138.

With D2 = "0", during each interval when the clock signal at the output of inverter 104 is a "1" and the clock signal at the output of inverter 106 is a "0", TGs 118 and 122 are open and TGs 120 and 124 are closed. Transistors 168 and 170 are enabled such that terminals 136 and 144 are set to a "1" and a "0", respectively. Transistors 162 and 166 are also enabled so that terminals 140 and 148 are set to a "0" and "1", respectively. Inverter 108 inverts the "1" on terminal 136 and generates a "0" on terminal 138. Closed TG 120 transmits the "0" on terminal 138 to terminal 140. Inverter 110 inverts the "0" on terminal 140 and generates a "1" on terminal 142. Inverter 112 inverts the "0" on terminal 144 and generates a "1" on terminal 146. Closed TG 124 transmits the "1" on terminal 146 to terminal 148. Inverter 114 inverts the "1" on terminal 148 and generates a "0" on terminal 150. Inverter 116 inverts the "0" on terminal 150 and generates a "1" on terminal 152.

Assume for purposes of illustration that the control signal D2 is a "0" so that terminal 142 is set to a "1" and terminal 150 is set to a "0". Between T=t0 and t1, the clock signal (waveform 501) at the output (terminal 131) of inverter 104 is a "1" and the clock signal (waveform 505) at the output (terminal 130) of inverter 106 is a "0". The input of inverter 108 shown in waveform 510 is a "1" and the output of inverter 108 shown in waveform 515 is a "0". Transmission gate 120 is closed. The input of inverter 110 shown in waveform 520 is therefore also a "0" and its output shown in waveform 525 is a "1". Transmission gate 122 is open so that the input of inverter 112 shown in waveform 530 is a "0" and the output of inverter 112 shown in waveform 535 is a "1". Since transmission gate 124 is closed, the input to inverter 114 shown in waveform 540 is also a "1" and its output shown in waveform 545 is a "0". As is shown by waveform 550, the output (terminal 116) of inverter 116 is a "1".

Between T=t1 and t2, transmission gates 118 and 122 are closed and transmission gates 120 and 124 are open in response to the "0" clock signal from inverter 104 (waveform 501) and the "1" clock signal from inverter 106 (waveform 505). Transmission gate 118 couples the "0" at the output of inverter 114 of shift register 134 (waveform 545) to the input of inverter 108 of shift register 132 (waveform 510) and transmission gate 122 couples the "1" at the output of inverter 110 in shift register 132 (waveform 525) to the input of inverter 112 in shift register 134 (waveform 530).

From T=t2 to t3, transmission gates 118 and 122 are open while transmission gates 120 and 124 are closed. Transmission gate 120 couples the "1" output of inverter 108 (waveform 515) to the input of inverter 110 (waveform 520) and transmission gate 124 couples the "0" from the output of inverter 112 (waveform 535) to the input of inverter 114 (waveform 540). Between T=t3 and t4, transmission gates 118 and 122 are closed and transmission gates 120 and 124 are open so that the "1" from the output of inverter 114 (waveform 545) is applied to the input of inverter 108 and the "0" output of inverter 110 (waveform 525) is transferred to the input of inverter 112 (waveform 530).

At T=t4, the clock output (terminal 131) of inverter 104 goes to a "1" while the clock output (130) of inverter 106 goes to a "0". Transmission gates 120 and 122 close and transmission gates 118 and 122 open whereby the "0" output of inverter 108 (waveform 515) is transferred to the input of inverter 110 (waveform 520) and the "1" output of inverter 112 (waveform 535) is transferred to the input of inverter 114 (waveform 540). During the interval from T=t0 to t4, two cycles of the output signal of the circuit 10 of FIG. 1 at terminal 30 of the frequency divider occur. In the same interval, the output of circuit 100 of FIG. 2 at inverter 116 (waveform 550) is a "0" between T=t0 and t2, a "1" between T=t2 and t4 and reverts to a "0" at T=t4. Consequently, the circuit 100 operates to divide the frequency of the input thereto at terminal 30 by two. The aforementioned operations are repeated between T=t4 and t8 and between T=t8 and t12.

As mentioned with respect to the circuit 10 of FIG. 1, prior known frequency counters have required a feedback path including devices that result in additional delay. In the circuit 100 of FIG. 2, the input signal is used to clock the serially connected shift registers 132 and 134 so that no devices are needed in the feedback path. The removal of such feedback path devices significantly increases the operating frequency. Initialization of second stage 100 is accomplished by resetting the shift register stages to one of two initial states corresponding to the selected phase of the control signal applied to the circuit 10 of FIG. 1.

Figure 3:
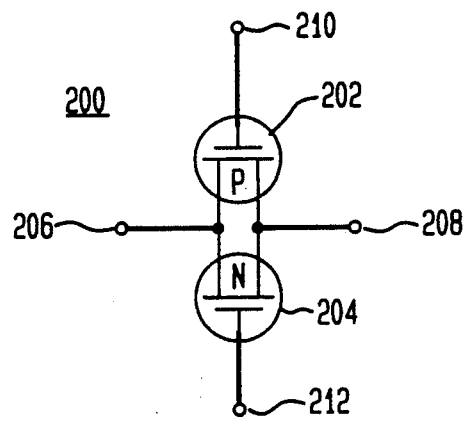
FIG. 3 is a schematic diagram of a transmission gate that is employed in the embodiment shown in FIG. 2.

Referring now to FIG. 3, there is shown a schematic diagram of a transmission gate 200 that can be used for transmission gate 118, 120, 122 and 124 of the circuit 100 of FIG. 2. The transmission gate 200 comprises a p-channel field effect transistor 202 and an n-channel field effect transistor 204. Each of the transistors has a gate, a drain and a source. The source of transistor 202 is coupled to the drain of transistor 204 and to a first input-/output terminal 206. The drain of transistor 202 is coupled to the source of transistor 204 and to a second input/output terminal 208. The gate of transistor 202 is coupled to a terminal 210, and the gate of transistor 204 is coupled to a terminal 212. Terminal 212 may be denoted as the direct clock input and terminal 210 may be denoted as the inverted clock input. Terminal 206 may be denoted as an input and terminal 208 may be denoted as an output.

In operation, the clock signals applied to terminals 210 and 212 are complementary square wave signals. Clock inverter terminal 210 receives a logical one ("1") while clock terminal 212 receives a logical zero ("0"). When clock terminal 210 receives a "0", clock terminal 212 receives a "1". Transistors 202 and 204 are enabled when a clock signal coupled to the gate of transistor 202 is a "0" and the clock signal coupled to the gate of transistor 204 is a "1". In this way, a bidirectional current path is established between terminals 206 and 208 in response to a "0" on terminal 210 and a "1" on terminal 212 since both transistors 202 and 204 are enabled. A "1" on terminal 210 and a "0" on terminal 212 disables transistors 202 and 204 and thus results in an open (high impedance) circuit between terminals 206 and 208.

It is to be understood that the specific embodiments described herein are intended merely to be illustrative of the spirit and scope of the invention. Modifications can readily be made by those skilled in the art consistent with the principles of this invention. For example, the sub-multiple clock signals CK1 and CK2 may be set at other than one-half the frequency of signal CLK. The devices used in the circuits of FIGS. 1 and 2 may comprise thin film transistors. Still further, the transistors 160, 162, 164, 166, 168 and 170 and the inverter 172 of circuit 100 of FIG. 2 can be replaced by a variety of different circuits, such as transmission gates, which perform the needed function. Furthermore, transistor 52 can be replaced by a variety of circuits, such as a transmission gate, which perform the needed function.

What is claimed is:

1. A frequency divider comprising:
storing means;
means for receiving a first frequency signal;
means for receiving at least one clock signal having a frequency that is a sub-multiple of the first frequency;
an output being adapted to be set to first and second logic states;
means responsive to the first frequency signal and the at least one sub-multiple frequency clock signal for generating a sub-multiple frequency signal at the output comprising:
means responsive to the first frequency signal for placing the storing means in a set condition;

means responsive to the at least one sub-multiple frequency signal for placing the storing means in a reset condition;

means responsive to the storing means being in its reset condition for setting the output to the first logic state; and means jointly responsive to the storing means being in its set condition and the first frequency signal for resetting the output to the second logic state.

2. The frequency divider of claim 1 wherein the storing means comprises a terminal for storing charge;

the sub-multiple frequency is half the first frequency;

the first frequency signal having even and odd cycles, each cycle including first and second portions;

the one-half frequency clock signal includes first and second phase half frequency clock signals each having first and second portions in each half frequency cycle, the first portion of the first phase half frequency clock signal being coincident with the first portion of every even first frequency cycle and the first portion of the second phase half frequency clock signal being coincident with the first portion of every odd first frequency clock signal;

the means for placing the storing means in a set condition comprises means responsive to the second portion of the first frequency signal in each cycle thereof for charging the storing means; and the means for placing the storing means in a reset condition comprises means responsive to the first portion of one of the first and second half frequency clock signals in each cycle thereof for discharging the storing terminal.

3. The frequency divider of claim 2 wherein:

the means for setting the output to the first logical state comprises means responsive to the storing terminal being charged for charging the frequency divider output; and the means for resetting the output to the second logic state comprises means responsive to the storing terminal being discharged and the first portion of the first frequency signal for discharging the frequency divider output.

4. The frequency divider of claim 3 wherein the means for discharging the storing terminal comprises means for selecting one of the first and second phase half frequency clock signals and means responsive to the selected one of the first and second phase half frequency clock signals for discharging the storing terminal.

5. The frequency divider of claim 2 further comprising means for initially setting the output to a preselected one of the first and second logic states.

6. A frequency divider comprising:

a first stage including storing means;

means for receiving a first frequency signal;

means for receiving at least one clock signal having a frequency that is a sub-multiple of the first frequency;

an output being adapted to be selectively set to first and second logic states;

means responsive to the first frequency signal and the at least one sub-multiple frequency clock signal for generating a sub-multiple frequency signal at the output comprising;

means responsive to the first frequency signal for placing the storing means in a set condition;

means responsive to the at least one sub-multiple frequency signal for placing the storing means in a reset condition;

means responsive to the storing means being in its reset condition for setting the output to the first logical state; and means jointly responsive to the storing means being in its set condition and the first frequency signal for resetting the output to the second logic state.

7. The frequency divider of claim 6 wherein the sub-multiple frequency clock signal comprises a plurality of different phase sub-multiple frequency clock signals; and the means responsive to the at least one sub-multiple frequency signal for placing the storing means in a reset condition comprises means for selecting one of the plurality of different phase sub-multiple clock signals and means responsive to the selected phase sub-multiple clock signal for placing the storing means in its reset condition at the phase of the selected sub-multiple clock signal.

8. The frequency divider of claim 6 wherein:

the storing means comprises a terminal for storing charge;

the means for placing the storing means in the set condition comprises means responsive to the first frequency signal for periodically charging the storing terminal to a first prescribed condition once in each cycle of the predetermined frequency; and the means for placing the storing terminal in the reset condition comprises means responsive to the at least one sub-multiple frequency signal for discharging the storing terminal once in each cycle of the sub-multiple frequency.

9. The frequency divider of claim 8 wherein:

the means for setting the output to the first logic state comprises means responsive to the storing terminal being discharged for charging the output to a first prescribed state; and the means for resetting the output to the second logic state comprises means jointly responsive to the storing terminal being in its charged condition and the first frequency signal for discharging the output to a second prescribed state once in each cycle of the sub-multiple frequency.

10. The frequency divider of claim 9 further comprising:

means for receiving a first voltage; and wherein the means for periodically charging the storing terminal once in each cycle of the predetermined frequency comprises:

a first device connected between the first voltage receiving means and the storing terminal having a gating means; and means for applying the first frequency signal to the gating means of the first device to couple the received first voltage to the storing terminal through the first device once in each cycle of the predetermined frequency.

11. The frequency divider of claim 10 further comprising:

means for receiving a second voltage; and wherein:

the means responsive to the at least one sub-multiple frequency signal for discharging the storing terminal to a second prescribed condition once in each cycle of the sub-multiple frequency comprises:

at least one second device connected between the second voltage receiving means and the storing terminal comprising gating means; and means for applying the received sub-multiple frequency clock signal to the gating means to couple the received second voltage to the storing terminal once in each cycle of the sub-multiple frequency clock signal.

12. The frequency divider of claim 11 wherein:

the first device is a transistor having a first electrode, a second electrode, and a gate electrode;

the first electrode of the first transistor being coupled to the first voltage receiving means;

the second electrode of the first transistor being coupled to the storing terminal; and the first frequency signal being applied to the gate electrode of the first transistor.

13. The frequency divider of claim 12 wherein:

the second device is a second transistor having a first electrode, a second electrode, and a gate electrode;

the first electrode of the second transistor being coupled to the first voltage receiving means;

the second electrode of the second transistor being coupled to the storing terminal; and the sub-multiple frequency clock signal being applied to the gate electrode of the second transistor.

14. The frequency divider of claim 13 wherein:

the means for setting the output to the first logic state comprises a third transistor having a first electrode, a second electrode and a gate electrode;

the gate electrode of the third transistor being connected to the storing terminal;

the first electrode of the third transistor being coupled to the first voltage receiving means;

the second electrode of the third transistor being coupled to the output.

15. The frequency divider of claim 14 wherein:

the means for resetting the output to the second logic state comprises a fourth transistor having a first electrode, a second electrode and a gate electrode;

the first electrode of the fourth transistor being connected to the second electrode of the third transistor;

the gate electrode of the fourth transistor being connected to the storing terminal; and means responsive to the first frequency signal for switchably connecting the second electrode of the fourth transistor to the second voltage receiving means once in each cycle of the first frequency.

16. The frequency divider of claim 15 wherein:

the means for switchably connecting the second electrode of the fourth transistor to the second voltage receiving means once in each cycle of the first frequency comprises:

a fifth transistor having a first electrode, a second electrode and a gate electrode;

the first electrode of the fifth transistor being connected to the second electrode of the fourth transistor;

the second electrode of the fifth transistor being connected to the second voltage receiving means; and means for applying the first frequency signal to the gate electrode of the fifth transistor.

17. The frequency divider of claim 6 wherein the sub-multiple frequency is one half the first frequency.

18. The frequency divider of claim 6 further comprising:

a second stage comprising:

first and second shift registers each having an input and an output;

means for coupling the output of the first shift register to the input of the second shift register and for coupling the output of the second shift register to the input of the first shift register;

means for initially storing a first state signal in the first shifter register and a second state signal in the second shift register; and means responsive to the output of the first stage for shifting the first state signal from the first shift register to the second shift register and the second state signal from the second shift register to the first shift register at a frequency that is one half the sub-multiple frequency of the first stage output.

19. The frequency divider of claim 18 wherein each shift register stage comprises:

first and second inverting means each having an input and an output;

first and second transmission gating means for selectively allowing a signal to pass therethrough;

means for applying the output of the first stage to the first and second transmission gating means;

the first gating means being connected between the shift register input and the input of the first inverter means;

the second gating means being connected between the output of the first inverter means and the input of the second inverter means; and the output of the second inverter means is connected to the shift register stage output.

20. The frequency divider of claim 19 wherein:

a signal at the output of the first stage comprises a first portion in the first logic state and a second portion in the second logic state in each cycle of the sub-multiple frequency;

the first gating means of the first shift register comprising means for coupling the second inverting means of the second shift register to the first inverting means of the first shift register in the first portion of the sub-multiple frequency output signal;

the first gating means of the second shift register comprising means for coupling the second inverting means of the first shift register to the first inverting means of the second shift register in the first portion of the sub-multiple frequency output signal;

the second gating means of the first shift register comprising means for coupling the first inverting means of the first shift register to the second inverting means of the first shift register in the second portion of the sub-multiple frequency output signal; and the second gating means of the second shift register comprising means for coupling the first inverting means of the second shift register to the second inverting means of the second shift register in the second portion of the sub-multiple frequency output signal whereby a signal at the output of the second shift register is at one half the sub-multiple frequency of the first stage output signal.

21. Circuitry comprising:

first, second third, fourth, fifth and sixth inverters each having an input and an output;

first, second, third and fourth transmission gates each having first and second input/outputs, a first control terminal and a second control terminal;

a circuitry input terminal coupled to the input of the first inverter, to the second control terminals of the first and third transmission gates and to the first control terminals of the second and fourth transmission gates;

the output of the first inverter being coupled to the first control terminals of the first and third transmission gates and to the second control terminals of the second and fourth transmission gates;

the second input/output of the first transmission gate being coupled to the input of the second inverter;

the output of the second inverter being coupled to the first input/output of the second transmission gate;

the second input/output of the second transmission gate being coupled to the input of the third inverter;

the output of the third inverter being coupled to the input/output of the third transmission gate;

the second input/output of the third transmission gate being coupled to the input of the fourth inverter;

the output of the fourth inverter being coupled to the first input/output of the fourth transmission gate;

the second input/output of the fourth transmission gate being coupled to the input of the fifth inverter;

the output of the fifth inverter being coupled to the input of the sixth inverter and to the first input/output of the first transmission gate;

the output of the sixth inverter being coupled to a circuitry output terminal; and setting means coupled to the second input/outputs of the transmission gates for selectively setting output signals levels thereof.

22. The circuitry of claim 21 further comprising:

seventh and eighth inverters each having an input and an output;

the input of the seventh inverter being coupled to the circuitry input terminal and the output of the seventh inverter being coupled to the input of the eighth inverter; and the output of the eighth inverter being coupled to the second control terminals of the first and third transmission gates and to the first control terminals of the second and fourth transmission gates such that the circuitry input terminal is coupled to the said control terminals through the seventh and eighth inverters.

23. The circuitry of claim 22 wherein:

the setting means comprises first, second, third, fourth, fifth and sixth transistors each having a control terminal and first and second output terminals and a ninth inverter having an input and an output;

the first output terminals of the first and fourth transistors are coupled to the output of the ninth inverter;

the first output terminals of the second and third transistors are coupled to the input of the ninth inverter;

the control terminals of all of the transistors are coupled together to a set terminal;

the second output terminal of the first transistor is coupled to the first output terminal of the fifth transistor;

the second output terminal of the fifth transistor is coupled to the second input/output terminal of the first transmission gate;

the control terminal of the fifth transistor is coupled to the second control terminal of the first transmission gate;

the second output terminal of the second transistor is coupled to the second input/output of the second transmission gate;

the second output terminal of the fourth transistor is coupled to the first output terminal of the sixth transistor;

the second output terminal of the six transistor is coupled to the second input/output terminal of the third transmission gate;

the control terminal of the six transistor is coupled to the second control terminal of the third transmission gate; and the second output terminal of the fourth transistor is coupled to the second input/output terminal of the fourth transmission gate.

24. The circuitry of claim 23 wherein each of the transistors is a field effect transistor having a gate, a drain and a source.

25. The circuitry of claim 24 wherein each of the transistors is an n-channel field effect transistor.

26. The circuitry of claim 25 wherein each of the n-channel transistors is a thin film field effect transistor.

27. Circuitry comprising:

first and second transistors of a first conductivity type with each having a control terminal and first and second output terminals;

third, fourth, fifth, sixth, seventh and eighth transistors of a second conductivity type with each having a control terminal and first and second output terminals;

an inverter having an input and an output;

a first circuitry input terminal coupled to the control terminals of the first and eighth transistors;

a second circuitry input terminal coupled to the control terminal of the third transistor;

a third circuitry input terminal coupled to the control terminal of the fourth transistor;

a fourth circuitry input terminal coupled to the control terminal of the fifth transistor;

the output of the inverter being coupled to the control terminal of the fifth transistor;

a circuitry output terminal being coupled to the first output terminals of the second and seventh transistors;

the first output terminals of the first, third and fifth transistors being coupled to the control terminals of the second and seventh transistors;

the second output terminal of the third transistor being coupled to the first output terminal fourth transistor;

the second output terminal of the fifth transistor being coupled to the first output terminal of the sixth transistor; and the second output terminal of the seventh transistor being coupled to the first output terminal of the eighth transistor.

28. The circuitry of claim 27 further comprising a ninth transistor of the second conductivity type having a control terminal coupled to a set input terminal, having a first output terminal coupled to the output of the inverter, and having a second output terminal coupled to the circuitry output terminal.

29. The circuitry of claim 28 wherein the second output terminals of the first and second transistors are coupled together, and the second output terminals of the fourth, sixth and eighth transistors are coupled together.

30. The circuitry of claim 29 wherein all of the transistors are field effect transistors.

31. The circuitry of claim 30 wherein all of the transistors are metal-oxide-semiconductor transistors and the first and second transistors are p-channel transistors and the third, fourth, fifth, sixth, seventh and eighth transistors are n-channel transistors.

32. The circuitry of claim 31 wherein the transistors are thin film transistors.

33. Circuitry comprising:
a first stage comprising:
first and second transistors of a first conductivity type with each having a control terminal and first and second output terminals;
third, fourth, fifth, sixth, seventh and eighth transistors of a second conductivity type with each having a control terminal and first and second output terminals;
an inverter having an input and an output;
a first circuitry input terminal coupled to the control terminals of the first and eighth transistors;
a second circuitry input terminal coupled to the control terminal of the third transistor;
a third circuitry input terminal coupled to the control terminal of the fourth transistor;
a fourth circuitry input terminal coupled to the control terminal of the fifth transistor;
the output of the inverter being coupled to the control terminal of the fifth transistor;
a first stage circuitry output terminal being coupled to the first output terminals of the second and seventh transistors;
the first output terminals of the first, third and fifth transistors being coupled to the control terminals of the second and seventh transistors;
the second output terminal of the third transistor being coupled to the first output terminal fourth transistor;
the second output terminal of the fifth transistor being coupled to the first output terminal of the sixth transistor; and
the second output terminal of the seventh transistor being coupled to the first output terminal of the eighth transistor; and
a second stage comprising:
first, second third, fourth, fifth and sixth inverters each having an input and an output;
first, second, third and fourth transmission gates each having first and second input/outputs, a first control terminal and a second control terminal;
a second stage circuitry input terminal coupled to the input of the first inverter, to the second control terminals of the first and third transmission gates and to the first control terminals of the second and fourth transmission gates;
the output of the first inverter being coupled to the first control terminals of the first and third transmission gates and to the second control terminals of the second and fourth transmission gates;
the second input/output of the first transmission gate being coupled to the input of the second inverter;
the output of the second inverter being coupled to the first input/output of the second transmission gate;
the second input/output of the second transmission gate being coupled to the input of the third inverter;
the output of the third inverter being coupled to the input/output of the third transmission gate;
the second input/output of the third transmission gate being coupled to the input of the fourth inverter;
the output of the fourth inverter being coupled to the first input/output of the fourth transmission gate;
the second input/output of the fourth transmission gate being coupled to the input of the fifth inverter;
the output of the fifth inverter being coupled to the input of the sixth inverter and to the first input/output of the first transmission gate;
the output of the sixth inverter being coupled to a circuitry output terminal; and
setting means coupled to the second input/outputs of the transmission gates for selectively setting output signals levels thereof.

34. Circuitry comprising:
a first stage comprising:
a storage means;
means for receiving a first frequency signal;
means for receiving at least one clock signal having a frequency that is a sub-multiple of the first frequency;
a first stage output being adapted to be selectively set to first and second logic states;
means responsive to the first frequency signal and the at least one sub-multiple frequency clock signal for generating a sub-multiple frequency signal at the first stage output comprising;
means responsive to the first frequency signal for placing the storing means in a set condition;
means responsive to the at least one sub-multiple frequency signal for placing the storing means in a reset condition;
means responsive to the storing means being in its reset condition for setting the output to the first logic state; and
means jointly responsive to the storing means being in its set condition and the first frequency signal for resetting the output to the second logic state; and
a second stage comprising:
first and second shift registers each having an input and an output;
control terminals of the first shift register being coupled to the output terminal of the first stage;
means for coupling the output of the first shift register to the input of the second shift register and for coupling the output of the second shift register to the input of the first shift register;
means for initially storing a first state signal in the first shifter register and a second state signal in the second shift register; and
means responsive to the output of the first stage for shifting the first state signal from the first shift register to the second shift register and the second state signal from the second shift register to the first shift register at a frequency that is one half the sub-multiple frequency of the first stage output.

* * * * *